United States Patent
Iwabuchi et al.

(10) Patent No.: US 8,519,442 B2
(45) Date of Patent: Aug. 27, 2013

(54) HIGH ELECTRON MOBILITY TRANSISTOR HAVING A HIGH SPEED SWITCHING FUNCTION

(75) Inventors: Akio Iwabuchi, Niiza (JP); Hironori Aoki, Niiza (JP)

(73) Assignee: Sanken Electric Co., Ltd., Niiza-shi (JP)

(*) Notice: Subject to any disclaimer, the term of this patent is extended or adjusted under 35 U.S.C. 154(b) by 0 days.

(21) Appl. No.: 13/251,563

(22) Filed: Oct. 3, 2011

(65) Prior Publication Data
US 2012/0080724 A1    Apr. 5, 2012

(30) Foreign Application Priority Data
Oct. 5, 2010    (JP) .................................. 2010-225438

(51) Int. Cl.
*H01L 29/66* (2006.01)

(52) U.S. Cl.
USPC ............... 257/194; 257/43; 257/76; 257/192; 257/284; 257/E21.403; 438/172; 438/285; 327/431

(58) Field of Classification Search
USPC ........... 257/76, 194, 192, 287, 343; 438/104, 438/172, 285
See application file for complete search history.

(56) References Cited

U.S. PATENT DOCUMENTS

| | | | |
|---|---|---|---|
| 7,288,803 B2 * | 10/2007 | Beach et al. | 257/192 |
| 7,465,997 B2 * | 12/2008 | Kinzer et al. | 257/401 |
| 7,859,021 B2 | 12/2010 | Kaneko | |
| 7,875,907 B2 * | 1/2011 | Honea et al. | 257/192 |
| 7,985,987 B2 | 7/2011 | Kaneko | |
| 2009/0032820 A1 * | 2/2009 | Chen | 257/76 |
| 2009/0072273 A1 * | 3/2009 | Briere | 257/194 |
| 2009/0206363 A1 * | 8/2009 | Machida et al. | 257/133 |
| 2010/0155720 A1 * | 6/2010 | Kaneko | 257/43 |
| 2010/0264461 A1 * | 10/2010 | Rajan et al. | 257/194 |
| 2012/0043588 A1 | 2/2012 | Iwabuchi et al. | |
| 2012/0126287 A1 | 5/2012 | Aoki | |

OTHER PUBLICATIONS

Double-Gate CMOS: Symmetrical—Versus Asymmetrical-Gate Devices Keunwoo Kim, Student Member, IEEE, and Jerry G. Fossum, Fellow, IEEE IEEE Transactions on Electron Devices, vol. 48, No. 2, Feb. 2001.*

* cited by examiner

*Primary Examiner* — Ha Tran T Nguyen
*Assistant Examiner* — Thai T Vuong
(74) *Attorney, Agent, or Firm* — Oblon, Spivak, McClelland, Maier & Neustadt, L.L.P.

(57) ABSTRACT

A semiconductor device includes a first semiconductor layer, a second semiconductor layer, a two-dimensional carrier gas layer, a first main electrode, a second main electrode, a first gate electrode, and a second gate electrode. The first gate electrode is provided between a part of the first main electrode and a part of the second main electrode opposite to the part of the first main electrode. The second gate electrode is provided between another part of the first main electrode and another part of the second main electrode opposite to the another part of the first main electrode with a separation region interposed between the first gate electrode and the second gate electrode. The second gate electrode is controlled independently of the first gate electrode.

7 Claims, 5 Drawing Sheets

(a)

(b)

(c)

HIGH ELECTRON MOBILITY TRANSISTOR HAVING A HIGH SPEED SWITCHING FUNCTION

BACKGROUND OF THE INVENTION

1. Field of the Invention

The present invention relates to a semiconductor device and, more specifically, relates to a semiconductor device including a switching element.

2. Description of the Related Art

High electron mobility transistors (HEMTs) including gallium nitride (GaN) compound semiconductors have been conventionally known. HEMTs have low on resistance and high breakdown voltage and are used in power applications, for example.

Kaneko (U.S. Pat. No. 7,859,021 B2) discloses a HEMT having a normally-off characteristic. This HEMT has a characteristic of going into an off state in the absence of a control signal applied to the gate electrode. In the off state, no current flows between the source and drain electrodes. Accordingly, it is not necessary to generate a negative control signal (negative potential) used to control the gate electrode, thus simplifying the structure of an electric circuit for driving the HEMT.

The HEMT disclosed in Kaneko, which has a normally-off characteristic, includes: a main semiconductor region having a two-dimensional carrier gas layer; a source electrode and a drain electrode which are located on a main surface of the main semiconductor region and are electrically connected to the two-dimensional carrier gas layer; a gate electrode located between the source and drain electrodes on the main surface of the main semiconductor region; and a metal-oxide semiconductor film located between the main surface of the main semiconductor region and the gate electrode. The metal-oxide semiconductor film is composed of materials such as a nickel oxide. This HEMT does not have an insulated gate structure but has a structure in which the gate electrode is laid on the main surface of the main semiconductor region with the metal oxide semiconductor film interposed therebetween. Moreover, it is known that HEMTs not having an insulated gate structure use materials capable of forming a Schottky contact with the main semiconductor region, such as nickel, for the gate electrode.

SUMMARY OF THE INVENTION

However, the HEMTs having the above-described gate structure does not consider the following factors. When a high frequency signal is supplied to the gate electrode to drive a inductive or resistive load using a HEMT as a high-speed switching element, wiring inductance between the drain electrode and the load causes an overshoot in drain voltage (drain-source voltage; VDS) according to −L·di/dt when the gate is turned off. If the occurrence of the overshoot causes a breakdown in the HEMT, the HEMT is instantly destroyed.

Moreover, if the drain voltage changes due to the overshoot, an overshoot occurs also in gate voltage VGS through a mirror capacitance between the drain and gate electrodes of the HEMT. In the HEMT not employing the insulated gate structure, application of a gate voltage over the rated voltage will cause leakage current. The maximum rated voltage of the gate voltage therefore needs to be set low. As a countermeasure for the overshoot caused in the gate voltage, it is effective to insert a series resistance in the gate electrode for analog handling. However, the insertion of the series resistance to the gate electrode results in delays of rise and fall times of the control signal (gate voltage), thus preventing high-speed switching operation of the HEMT.

The present invention provides a semiconductor device including a switching element capable of implementing higher speed switching operation with occurrence of overshoots reduced to prevent device destruction.

A semiconductor device according to a first aspect of the present invention includes: a first semiconductor layer; a second semiconductor layer provided on the first semiconductor layer with a heterojunction interface interposed therebetween; a two-dimensional carrier gas layer provided near the heterojunction interface in the first semiconductor layer; a first main electrode electrically connected to one end of the two-dimensional carrier gas layer; a second main electrode electrically connected to the other end of the two-dimensional carrier gas layer; a first gate electrode provided on the second semiconductor layer between a part of the first main electrode and a part of the second main electrode opposite to the part of the first main electrode; and a second gate electrode which is provided on the second semiconductor layer between another part of the first main electrode and another part of the second main electrode opposite to the another part of first main electrode with a separation region interposed between the first gate electrode and the second gate electrode and is controlled independently of the first gate electrode, the separation region having a sheet resistance higher than a sheet resistance of the two-dimensional carrier gas layer.

A semiconductor device according to a second aspect of the present invention includes: a first semiconductor layer; a second semiconductor layer provided on the first semiconductor layer with a heterojunction interface interposed therebetween; a two-dimensional carrier gas layer provided near the heterojunction interface in the first semiconductor layer; a first main electrode electrically connected to one end of the two-dimensional carrier gas layer; a second main electrode electrically connected to the other end of the two-dimensional carrier gas layer; and a gate electrode provided on the second semiconductor layer between the first main electrode and the second main electrode opposite to the first main electrode. Threshold voltage right under a part of the gate electrode in the gate width direction is different from threshold voltage right under another part of the gate electrode in the gate width direction.

According to the aspects of the present invention, it is possible to provide a semiconductor device including a switching element capable of implementing higher speed switching operation with occurrence of overshoots reduced to prevent device destruction.

DETAILED DESCRIPTION OF THE EMBODIMENTS

Figure 1:
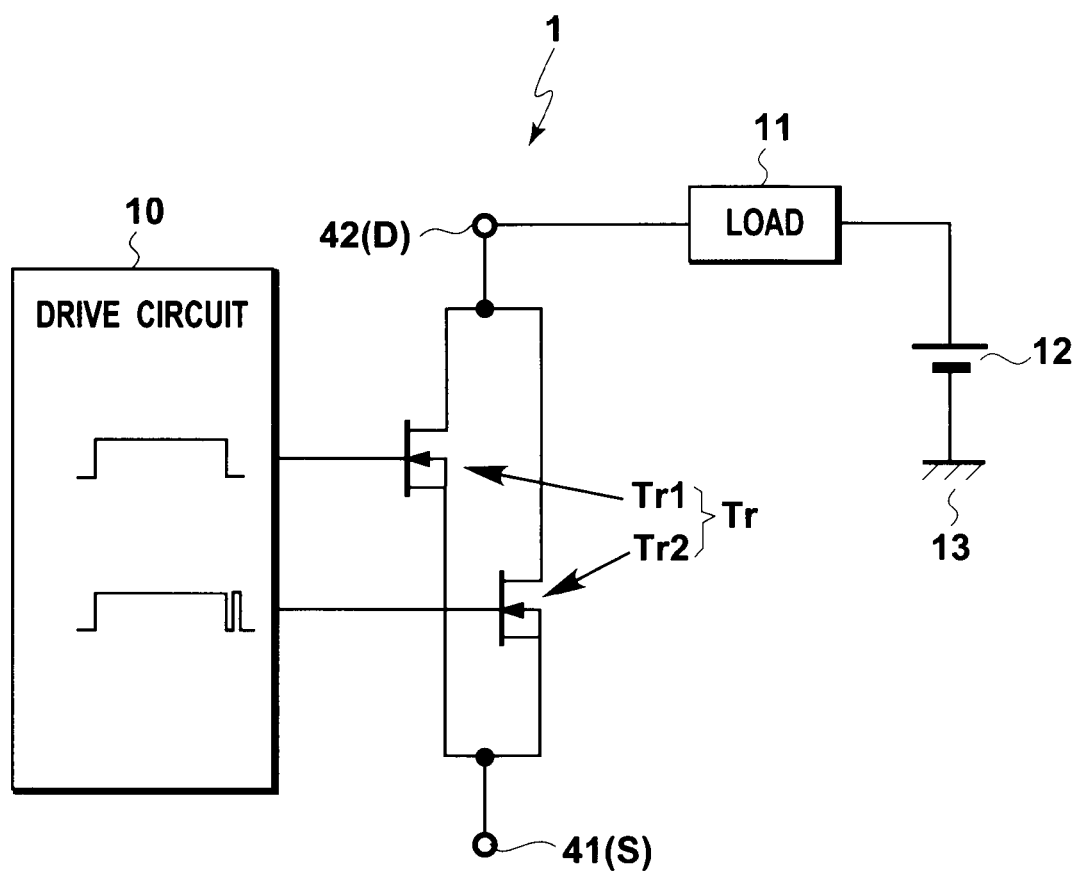
FIG. 1 is a circuit diagram including a semiconductor device according to Embodiment 1.

Next, embodiments of the present invention are described with reference to the drawings. In the following description of the drawings, same or similar portions are given same or similar reference numerals. It should be noted that the drawings are schematic and are different from the real ones. Some portions have different dimensional relations and proportions through the drawings.

The following embodiments describe devices and methods to embody the technical idea of the present invention by example. The technical ideas of the present invention do not specify the arrangements and the like of the constituent components as described below. Moreover, the technical idea of the present invention can be various changed within the scope of claims.

(Embodiment 1)

In Embodiment 1, a description is given of an example of a semiconductor device including a HEMT having a normally-off structure to which the present invention is applied.

[Circuit Configuration of Semiconductor Device]

As illustrated in FIG. 1, a semiconductor device 1 according to Embodiment 1 includes an n-channel conductivity type HEMT (Tr) having a normally-off structure. In Embodiment 1, the HEMT (Tr) includes n-channel conductivity type first HEMT (Tr1) and second HEMT (Tr2) having a normally-off structure. The first and second HEMTs (Tr1 and Tr2) are electrically connected in parallel.

The first HEMT (Tr1) of the HEMT (Tr) includes a first main electrode 41 used as a source electrode (S), a second main electrode 42 used as a drain electrode (D), and a first gate electrode (G1) 51. The second HEMT (Tr2) includes the first main electrode 41 shared with the first HEMT (Tr1), the second main electrode 42 also shared with the first HEMT (Tr2), and a second gate electrode (G2) 52 which is electrically separated from the first gate electrode 51 and is controlled independently of the first gate electrode 51.

The second main electrode 42 is connected to the positive electrode of a power supply 12 through a load 11 such as an inductive or resistive load. The negative electrode of the power supply 12 is connected to a reference potential (ground potential) 13, for example. The load 11 and power supply 12 are configured as external parts of the semiconductor device 1 in Embodiment 1 but may be included in the semiconductor device 1.

The first and second gate electrodes 51 and 52 are connected to a drive circuit 10 individually controlling on and off operations of the first and second HEMTs (Tr1 and Tr2). Similarly to the load 11 and power supply 12, the drive circuit 10 is configured as an external part of the semiconductor device 1 in Embodiment 1 but may be included in the semiconductor device 1.

The semiconductor device 1 according to Embodiment 1 includes two HEMTs of the first and second HEMTs (Tr1 and Tr2) but may be include three or more HEMTs electrically connected in parallel.

[Device Structure of Semiconductor Device]

Figure 2:
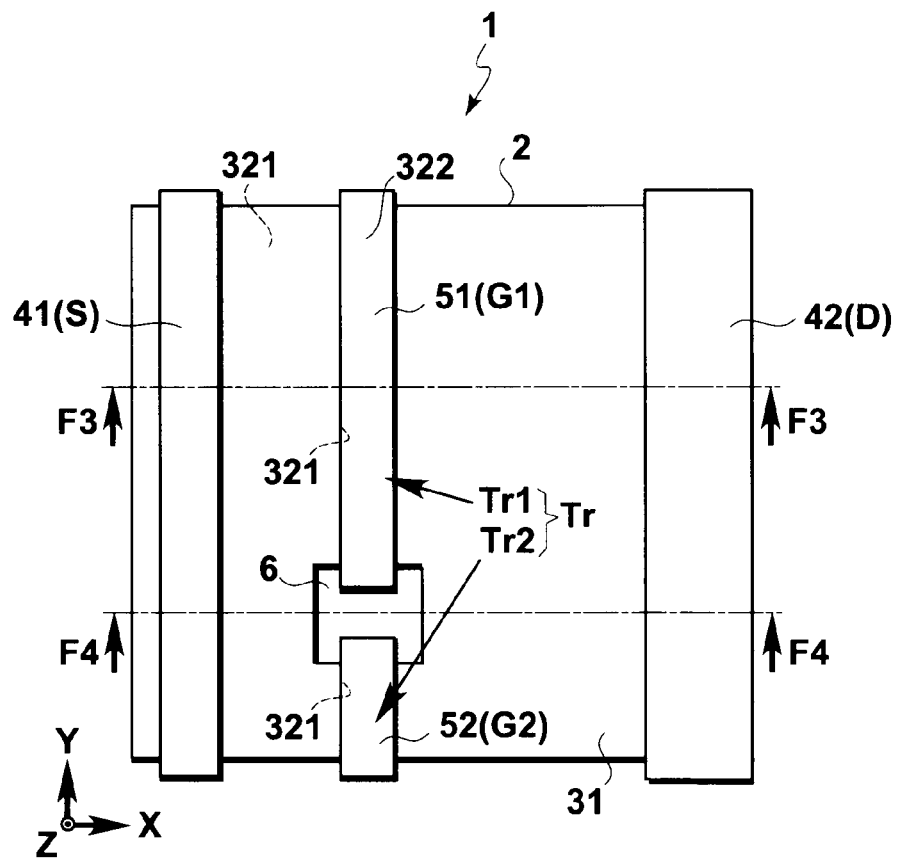
FIG. 2 is a main portion plan view illustrating a structure of a HEMT mounted on the semiconductor device according to Embodiment 1.
Figure 3:
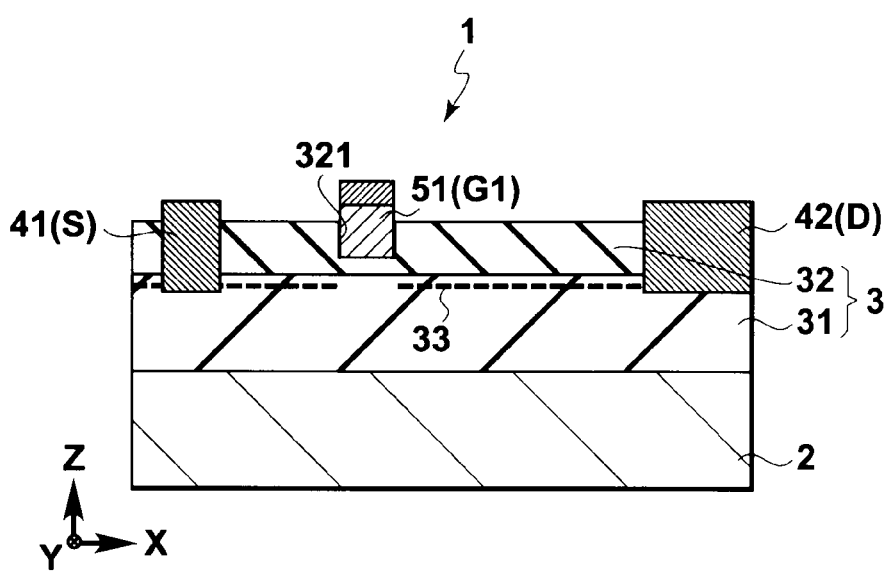
FIG. 3 is a main portion cross-sectional view taken along a cutting line F3-F3 (a part of a first gate electrode) of the HEMT illustrated in FIG. 2.
Figure 4:
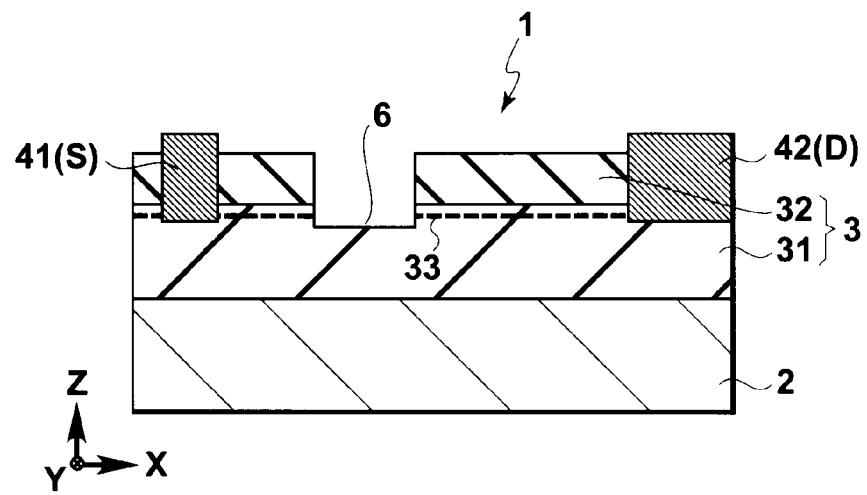
FIG. 4 is a main portion cross-sectional view taken along a cutting line F4-F4 (a separation region) of the HEMT illustrated in FIG. 2.

As illustrated in FIGS. 2 to 4, the first HEMT (Tr1) of the HEMT (Tr) mounted on the semiconductor device 1 according to Embodiment 1 includes: a substrate 2; a first semiconductor layer 31 on the substrate 2; a second semiconductor layer 32 located on the first semiconductor layer 31 with a heterojunction interface interposed therebetween; a two-dimensional carrier gas layer 33 located in the second semiconductor layer 31 near the heterojunction interface; a first main electrode (S) 41 electrically connected to an end of the two-dimensional carrier gas layer 33; a second main electrode (D) 42 electrically connected to the other end of the two-dimensional carrier gas layer 33; and a first gate electrode (G1) 51. The first gate electrode (G1) 51 is located above the second semiconductor layer 32 between a part of the first main electrode 41 in the gate width direction (an upper part of the first main electrode 41 in FIG. 2) and a part of the second main electrode 42 in the gate width direction (an upper part of the second main electrode 42 in FIG. 2) which is opposite to the same part of the first main electrode 41.

The second HEMT (Tr2) includes: the substrate 2; the first semiconductor layer 31; the second semiconductor layer 32; and the two-dimensional carrier gas layer 33; the first and second main electrodes (S, D) 41 and 42 shared with the first HEMT (Tr1); and a second electrode (G2) 52, which are the same as those of the first HEMT (Tr1) or constitute the same layers as those of the first HEMT (Tr1). The second gate electrode (G2) 52 is located above the two-dimensional carrier gas layer 33 between another part of the first main electrode 41 in the gate width direction (a lower part of the first main electrode 41 in FIG. 2) and another part of the second main electrode 42 in the gate width direction (a lower part of the second main electrode 42 in FIG. 2) which is opposite to the same another part of the first main electrode 41. Between the second gate electrode (G2) 52 and the first gate electrode 51, a separation region 6 is provided. The separation region 6 has a sheet resistance higher than that of the two-dimensional carrier gas layer 33. The second gate electrode (G2) 52 is controlled independently of the first gate electrode 51.

In Embodiment 1, the substrate 2 is a silicon single-crystalline semiconductor substrate (Si substrate). The substrate 2 is not limited to this and can be a sapphire substrate, a silicon carbide substrate (SiC substrate), a GaN substrate, or the like, for example.

A publicly-known buffer layer (not shown) can be provided between the substrate 2 and the first semiconductor layer 31. The buffer layer is composed of a group III nitride semiconductor material. Typical group III nitride semiconductors are represented by $Al_xIn_yGa_{1-x-y}N$ ($0<=x<=1$, $0<=y<=1$, $0<=x+y<=1$). In Embodiment 1, the buffer layer can be (but not limited to) a composite film including a plurality of GaN layers and a plurality of AlN layers alternately stacked on each other.

The first and second semiconductor layers 31 and 32 constitute a semiconductor function layer 3 in which the HEMTS (Tr) are really mounted. The first semiconductor layer 31 of the semiconductor function layer 3 is composed of a nitride semiconductor layer, specifically, a GaN layer. The first semiconductor layer 31 functions as a carrier travel layer. In the HEMTS (Tr) according to Embodiment 1, the carriers are electrons, and the first semiconductor layer 31 functions as an electron travel layer. The second semiconductor layer 32 is composed of a nitride semiconductor layer. Specifically, the second semiconductor layer 32 is composed of an AlGaN layer having a lattice constant smaller than that of the semiconductor layer 31 and having a band gap larger than that of the first semiconductor layer 31. The second semiconductor layer 32 functions as a carrier supply layer. In Embodiment 1, the second semiconductor layer 32 functions as an electron supply layer.

The two-dimensional carrier gas layer 33 is specifically a two-dimensional electron gas (2DEG) layer. The two-dimensional carrier gas layer 33 is extended from left to right in the direction X in FIGS. 2 to 4. The two-dimensional carrier gas layer 33 functions as a channel region in which current (or electrons or holes) flows in the direction X or in the opposite direction thereto. A direction Y refers to a direction crossing the direction that the two-dimensional carrier gas layer 33 is extended (the direction X) in a plane parallel to the heterojunction interface.

In Embodiment 1, the thickness of the first semiconductor layer 31 used in the semiconductor device 1 is, but not necessarily limited to, set in a range of 0.5 to 10.0 μm. Herein, since the semiconductor layer 31 is a GaN layer, the thickness of the GaN layer is set to 2.5 to 3.5 μm, for example. The thickness of the AlGaN layer as the second semiconductor layer 32 is set in a range of 5.0 and 100.0 nm, for example and is set to 30 nm herein, for example.

The first main electrode 41 is electrically connected to an end of the two-dimensional carrier gas layer 33 through an ohmic contact. The source electrode 41 is partially embedded in a trench dug from the surface of the second semiconductor layer 32 through the heterojunction interface at least to the two-dimensional carrier gas layer 33 of the first semiconductor layer 31. The electrode material of the first main electrode 41 forming an ohmic contact can be a laminate film including a Ti layer and an Al layer laid thereon. Herein, the Ti layer has a thickness of 10 to 50 nm, and the Al layer has a thickness of 100 to 1000 nm, for example. As illustrated in FIG. 3, the first main electrode 41 has a rectangular cross-sectional shape having a thickness dimension in the direction Z not so different from the width dimension in the direction X. As illustrated in FIG. 2, the planar shape of the source electrode 41 is a stripe shape having a length in the direction Y greater than the width dimension in the direction X. Herein, the direction Z refers to a direction perpendicular to the heterojunction interface.

The second main electrode 42 is electrically connected to the other end of the two-dimensional carrier gas layer 33 through an ohmic contact. Similar to the first main electrode 41, the second main electrode 42 is partially embedded in a trench dug from the surface of the second semiconductor layer 32 through the heterojunction interface to reach at least the two-dimensional carrier gas layer 33 of the first semiconductor layer 31. The electrode material of the second main electrode 42 is the same as that of the first main electrode 41. The cross-sectional and planer shapes of the second main electrode 42 are the same as those of the first main electrode 41 herein.

At least one of the first and second main electrodes 41 and 42 is not limited to the structure partially embedded in the trench and can be located on the surface of the second semiconductor layer 32.

The first gate electrode 51 of the first HEMT (Tr1) is located in adjacent to the surface of the second semiconductor layer 32 directly above the two-dimensional carrier gas layer 33 between a part of the first main electrode 41 in the gate width direction and a part of the second main electrode 42. In Embodiment 1, the gate width direction is the direction Y, and the gate length direction is the direction X. In Embodiment 1, the gate electrode 51 is (not limited to such a structure) located on the bottom surface of a recess (hollow) 321 (on the surface of the second semiconductor layer 32 in the recess 321). The recess 321 is dug in the depth direction from the surface of the second semiconductor layer 32 to a part of the thickness of the second semiconductor layer 32. When the second semiconductor layer 32 has a thickness of 30 nm, for example, the depth of the recess 321 is set to, for example, 23 to 27 nm and preferably to 25 nm.

The first gate electrode 51 can be composed of a p-type semiconductor layer such as a GaN layer doped with Mg or an AlGaN layer doped with Mg, a metal oxide layer such as a nickel oxide layer, an iron oxide layer, a cobalt oxide layer, a manganese oxide layer, or a copper oxide layer, or a Schottky material such as Ni, for example. The metal layer can be an Au layer, for example. The first HEMT (Tr1) has a normally-off characteristic, and the threshold value Vth of the first HEMT (Tr1) is set to several volts, for example.

The second gate electrode 52 of the second HEMT (Tr2) is located in adjacent to the surface of the second semiconductor layer 32 above the two-dimensional carrier gas layer 33 between the another part of the first main electrode 41 in the gate width direction and the another part of the second main electrode 42. The basic structure and material of the second gate electrode 52 are the same as those of the first gate electrode 51. The second HEMT (Tr2) has a normally-off characteristic similarly to the first HEMT (Tr1), and the threshold value Vth of the second HEMT (Tr2) is set to several volts, for example.

In Embodiment 1, the second gate electrode 52 is located on an extension of the first gate electrode 51 in the gate width direction (direction Y). In other words, the distance between the first main electrode 41 and first gate electrode 51 of the first HEMT (Tr1) and the distance between the first gate electrode 51 and the second main electrode 42 are set equal to the distance between the first main electrode 41 and second gate electrode 52 of the second HEMT (Tr2) and the distance between the second gate electrode 52 and the second main electrode 42, respectively. The gate width dimension of the first gate electrode 51 of the first HEMT (Tr1) is set larger than that of the second gate electrode 52 of the second HEMT (Tr2). The gate width dimensions are determined by both current amounts. In Embodiment 1, the ratio of the gate width dimension of the first gate electrode 51 to that of the second gate electrode 52 is set to 100/1 or less.

Figure 5:
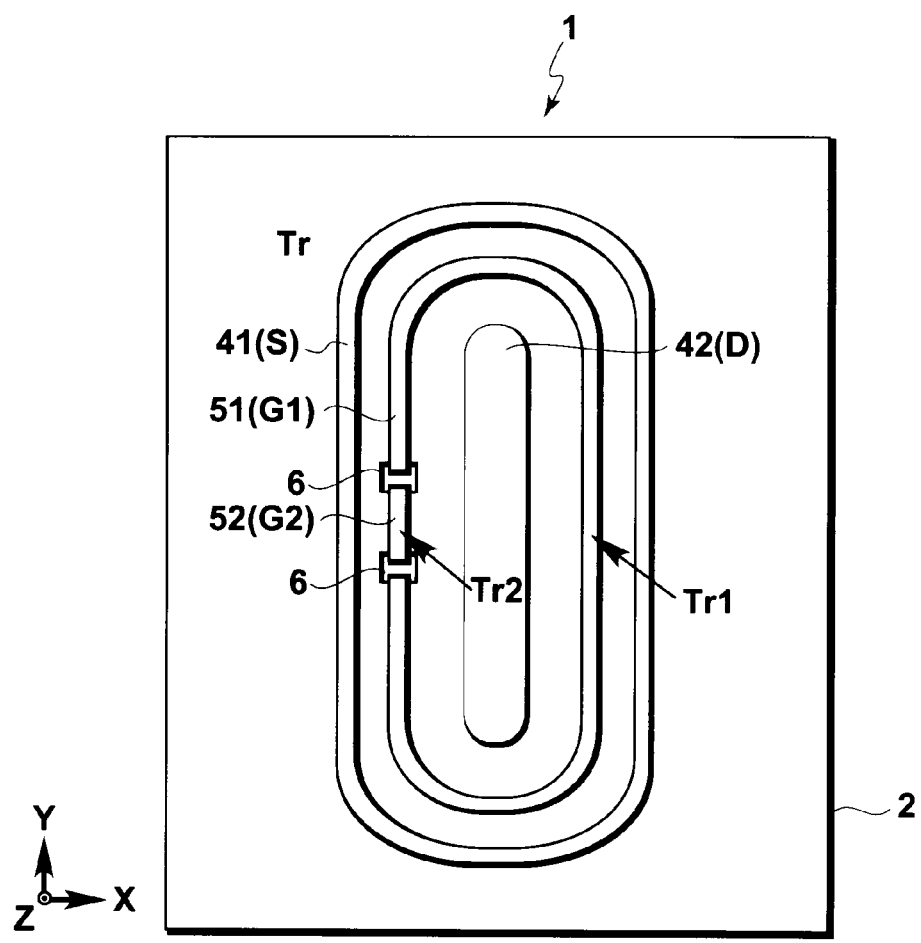
FIG. 5 is an entire plan view of the HEMT illustrated in FIG. 2.

As illustrated in FIG. 5, the semiconductor device 1 according to Embodiment 1 includes the second main electrode 42, first main electrode 41, first gate electrode 51, and second gate electrode 52. The second main electrode 42 has an oblong planar shape. The first main electrode 41 has an annular planar shape and is arranged around the second main electrode 42 at a certain distance from the second main electrode 42. The first gate electrode 51 is arranged between the second and first main electrodes 42 and 41 along most of the periphery of the second main electrode 42 around the second main electrode 42. The second gate electrode 52 is arranged between the second and first main electrodes 42 and 41 along a small part of the periphery of the second main electrode 42 around the second main electrode 42.

In Embodiment 1, the one HEMT (Tr) is composed of the two first and second HEMTs (Tr1 and Tr2) electrically connected in parallel. However, the one HEMT (Tr) may be composed of three or more HEMTs (first to n-th HEMTs (Tr1 to Trn), n is an integer not less than three.) which are electrically connected in parallel. In this case, the gate width of the n-th gate electrode of the n-th HEMT (Trn) is set equal to or smaller than the gate width of the second gate electrode 52 of the second HEMT (Tr2).

In Embodiment 1, as illustrated especially in FIG. 4, the separation region 6 is composed of a recess dug from the surface of the second semiconductor layer 32 in the depth direction thereof through the second semiconductor layer 32 to a part of the thickness of the first semiconductor layer 31. The bottom surface of the recess of the separation region 6 is positioned deeper than the two-dimensional carrier gas layer 33. Accordingly, the depth of the recess (the bottom of the recess) is positioned deeper than the depth of the recess 321 (the bottom of the recess 321) on which the first or second gate electrode 51 and 52 is located. The bottom of the recess of the separation region 6 may be within the second semiconductor layer 32. The separation region 6 increases the channel resistance (sheet resistance) between the two-dimensional gas layer 33 of the first HEMT (Tr1) and the two-dimensional gas layer 33 of the second HEMT (Tr2) for electrical separation.

In Embodiment 1, the separation region 6 is set a little larger than the gate length dimensions (the dimensions in the direction X) of the first and second gate electrodes 51 and 52 and the distance between the first and second gate electrodes 51 and 52 (the dimension in the direction Y). Herein, the both dimensions of the separation region 6 are set larger by at least an alignment margin at the manufacturing process in order to prevent leakage current between the first and second main electrodes 41 and 42 caused by misalignment between the separation region 6 and the first or second gate electrode 51 and 52. The above dimensions of the separation region 6 are the minimum dimensions. The dimension of the separation region 6 in the direction Y is difficult to increase because the larger the separation region 6 in the direction Y, the smaller the amounts of current of the first and second HEMTs (Tr1 and Tr2). However, the dimension of the separation region 6 in the direction X can be increased. The separation regions 6 may be extended in the direction X so as to cross over the first main electrode 41 and drain region 42.

The first and second gate electrodes 51 and 52 are connected to the drive circuit 10 through not-illustrated interconnections in the upper layer.

[Operational Mechanism of Semiconductor Device]

The semiconductor device 1 illustrated in FIGS. 1 to 5 includes the following operational mechanism.

Figure 6:
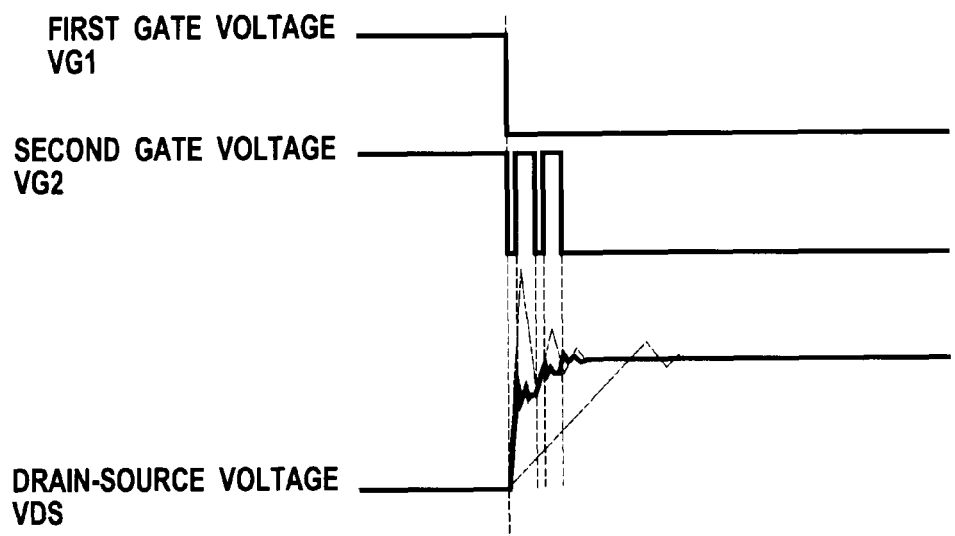
FIG. 6 is a timing chart explaining (a): an operation of the semiconductor device according to Embodiment 1, (b): an operation of a semiconductor device according to a first comparative example, and (c) an operation of a semiconductor device according to a second comparative example.
Figure 6:
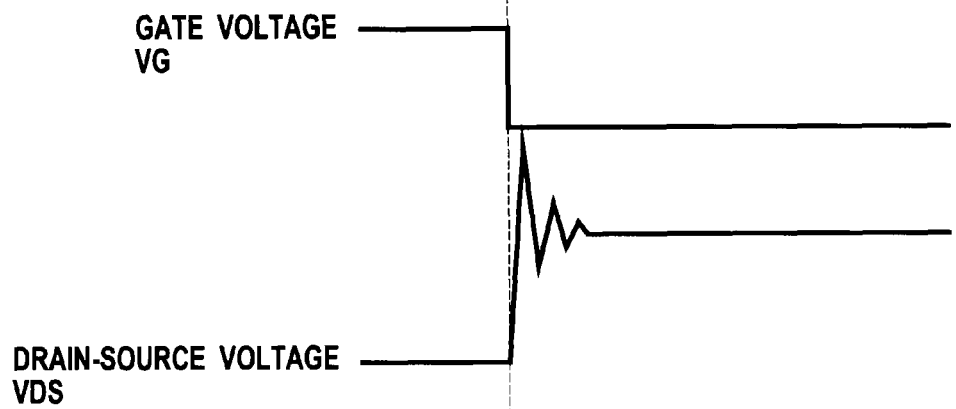
Figure 6:
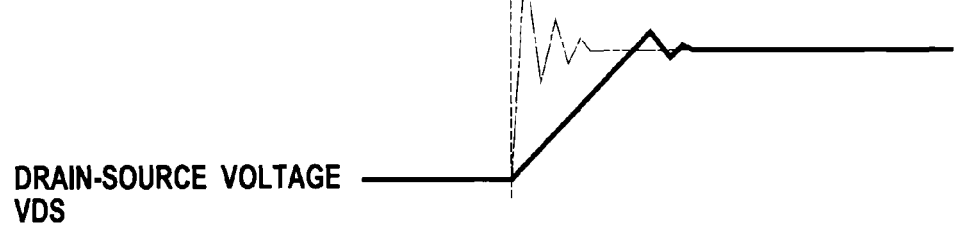

Waveforms (b) in a timing chart of FIG. 6 explain an operation of a semiconductor device (HEMT) according to a first comparative example. The vertical axis indicates gate voltage VG and drain-source voltage VDS, and the horizontal axis indicates time. In response to a fall of the gate voltage VG of the HEMT, the HEMT is turned off, and the drain-source voltage VDS increases. However, because of the inductive or resistive load applied to the second main electrode, an overshoot occurs at the rise of the drain-source voltage VDS. In the HEMT not including an insulated gate structure, the overshoot could cause breakdown between the gate electrode and a part of the two-dimensional carrier gas layer on the second main electrode side, leading to destruction of the HEMT.

Waveform (c) in the timing chart of FIG. 6 explains an operation of a semiconductor device (HEMT) according to a second comparative example. The vertical axis indicates drain-source voltage VDS when a series resistance is inserted in the gate electrode, and the horizontal axis indicates time. In response to a fall of the gate voltage VG of the HEMT (turning-off operation), the HEMT is turned off, and the drain-source voltage VDS increases. Since the series resistance is inserted in the gate electrode, the amount of overshoot is reduced at the rise of the drain-source voltage VDS compared to the first comparative example. However, the insertion of the series resistance increases the time constant and therefore increases the rise time of the drain-source voltage VDS.

Waveforms (a) in the timing chart of FIG. 6 explain an operation of the semiconductor device 1 according to Embodiment 1. The vertical axis indicates first gate voltage VG1 supplied to the first gate electrode 51, second gate voltage VG2 supplied to the second gate electrode 52, and the drain-source voltage VDS. The horizontal axis indicates time.

In the HEMT (Tr), in response to a fall of the first gate voltage VG1 of the first HEMT (Tr1), the first HEMT (Tr1) is turned on. At the same time of the fall of the gate voltage VG1 of the first HEMT (Tr1), the second gate voltage VG2 of the second HEMT (Tr2) is dropped. Subsequently, the second gate voltage VG2 of the second HEMT (Tr2) is repeatedly raised and dropped in a certain short time to repeat on and off controls of the second HEMT (Tr2) in short time. The second gate voltage VG2 rises and falls according to a gate signal which has a pulse waveform and is outputted from the drive circuit 10 illustrated in FIG. 1.

As illustrated in (a) of FIG. 6, the drain-source voltage VDS rapidly rises by the on operations of the first HEMT (Tr1) with large current amount and the second HEMT (Tr2) with small current amount. However, the second HEMT (Tr2) is repeatedly turned on and off at a delayed time. The di/dt component of the drain voltage can be therefore digitally (stepwisely) reduced. Accordingly, the overshoot caused in the drain-source voltage VDS can settle in short time. In the semiconductor device 1 according to Embodiment 1, compared to the first comparative example illustrated in (b) of FIG. 6, the amount of overshoot occurring in the drain-source voltage VDS can be reduced. In the semiconductor device 1 according to Embodiment 1, furthermore, compared to the second comparative example illustrated in (c) of FIG. 6, the amount of overshoot occurring in the drain-source voltage VDS can be reduced, and the overshoot can settle in short time.

In the semiconductor device 1 according to Embodiment 1, if the HEMT (Tr) is composed of three or more HEMTs (first HEMT (Tr1) to n-th HEMT (Trn)), after dropping the first gate voltage VG1 supplied to the first gate electrode 51 of the first HEMT (Tr1), control is made so as to sequentially drop the second gate voltage VG2 supplied to the second gate electrode 52 of the second HEMT (Tr2), ..., and n-th gate voltage VGn (Trn) supplied to an n-th gate electrode 5n of the n-th HEMT (Trn).

[Characteristic of Semiconductor Device]

As described above, in the semiconductor device 1 according to Embodiment 1, the HEMT (Tr) is composed of the first HEMT (Tr1) and the second HEMT (Tr2) electrically connected in parallel by the separation region 6, and the first gate electrode 51 of the first HEMT (Tr1) and the second gate electrode 52 of the second HEMT (Tr2) can be independently controlled. This can reduce overshoots. It is therefore possible to prevent device destruction and cause overshoot to settle in short time, thus implementing higher speed switching operation.

(Embodiment 2)

In Embodiment 2, a description is given of the semiconductor device 1 of Embodiment 1 with the configuration of the separation region 6 substituted.

[Device Structure of Semiconductor Device]

Figure 7:
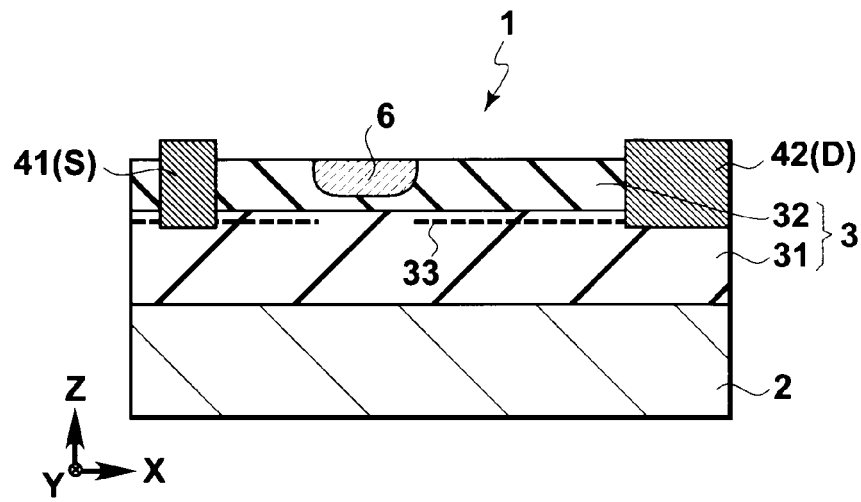
FIG. 7 is a main portion cross-sectional view illustrating a structure of the separation region of a HEMT mounted on a semiconductor device according to a second embodiment.

As illustrated in FIG. 7, in the semiconductor device 1 according to Embodiment 2, the separation region 6 is provided at least between the first gate electrode 51 of the first HEMT (Tr1) and the second gate electrode 52 of the second HEMT (Tr2) within the second semiconductor layer 32. The separation region 6 is composed of an impurity introduced region in which ions having high electronegativity such as fluorine (F), iron (Fe), or magnesium (Mg) ions. The ions with high electronegativity generate fixed negative charges in a part of the second semiconductor layer 32 in the thickness direction. The fixed negative charges have a function of extruding carriers (electrons herein) of the two-dimensional carrier gas layer 33 generated right under the fixed negative charges. In other words, the separation region 6 reduces the carrier concentration of the two-dimensional carrier gas layer 33 generated right under the separation region 6 or prevents the generation of the two-dimensional carrier gas layer 33. The channel resistance (sheet resistance) of the two-dimensional carrier gas layer 33 right under the separation region 6 is therefore highly controllable.

The separation region 6 is formed by introducing ions with high electronegativity into the second semiconductor layer 32 by plasma immersion ion implantation (PIII) using a resist mask formed using photolithography, for example.

[Characteristic of Semiconductor Device]

As described above, the semiconductor device 1 according to Embodiment 2 can provide the same operational effect as those provided by the semiconductor device 1 according to Embodiment 1.

(Embodiment 3)

In Embodiment 3, a description is given of an example of the semiconductor device 1 according to Embodiment 1 or 2 in which the threshold voltage of the first HEMT (Tr1) of the HEMT (Tr) is set different from the threshold voltage of the second HEMT (Tr2) to allow on and off operations of the first HEMT (Tr1) and the second HEMT (Tr2) to be independently controlled.

[Device Structure of Semiconductor Device]

Figure 8A:
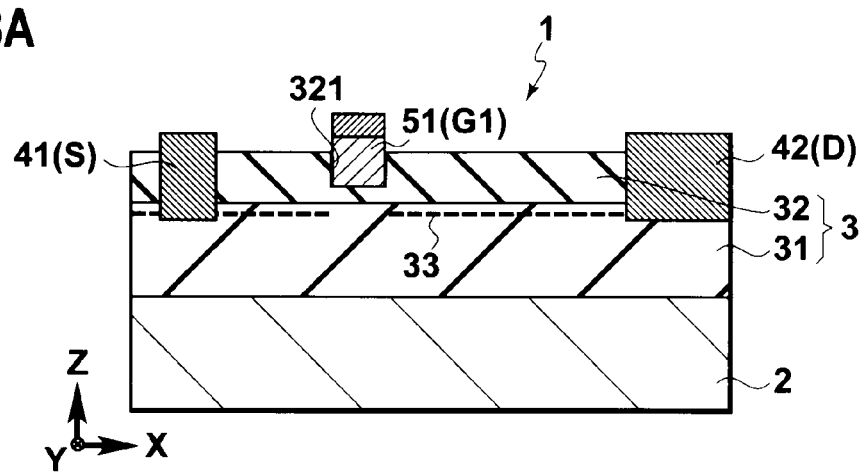
FIG. 8A is a main portion cross-sectional view illustrating a structure of a part of a gate electrode of a HEMT mounted on a semiconductor device according to Embodiment 3.
Figure 8B:
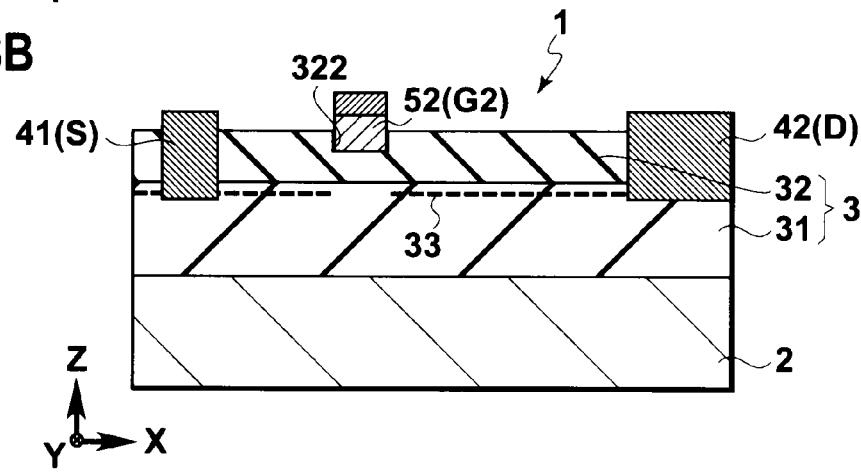
FIG. 8B is a main portion cross-sectional view illustrating another part of the gate electrode of the HEMT mounted on the semiconductor device according to Embodiment 3.

As illustrated in FIGS. 8A and 8B, the semiconductor device 1 according to Embodiment 3 includes: a first semiconductor layer 31; a second semiconductor layer 32 located on the first semiconductor layer 31 with the heterojunction interface interposed therebetween; a two-dimensional carrier gas layer 33 located near the heterojunction interface of the first semiconductor layer 31; a first main electrode (source electrode ((s)) 41 electrically connected to one end of the two-dimensional carrier gas layer 33; a second main electrode (drain electrode (D)) 42 electrically connected to the other end of the two-dimensional carrier gas layer 33; and a first gate electrode (G1) 51 and a second gate electrode (G2) 52 located on the second semiconductor layer 32 between the first main electrode 41 and the second main electrode opposite to the first main electrode 41. The threshold voltage right under the first gate electrode 51 (a part of the gate electrode in the gate width direction in the region of the first HEMT (Tr1)) is different from that of the second gate electrode 52 (another part of the gate electrode in the gate width direction in the region of the second HEMT (Tr2)).

The first gate electrode 51 is located within a recess 321 formed in the second semiconductor layer 32 in the region of the first HEMT (Tr1). The second gate electrode 52 is located within a recess 322 which is formed in the second semiconductor layer 32 in the region of the second HEMT (Tr2) and is shallower than the recess 321. In Embodiment 3, in other words, the threshold voltage of the first HEMT (Tr1) is set high, and the threshold voltage of the second HEMT (Tr2) is set lower than that of the first HEMT (Tr1), for example.

In Embodiment 3, the gate electrodes 51 and 52 are separated by the separation region 6 (not shown) in a similar manner to the semiconductor device 1 according to Embodiment 1 or 2, and the first gate electrode 51 and the second gate electrode 52 are independently controlled using the drive circuit 10.

The operational mechanism of the semiconductor device 1 according to Embodiment 3 is the same as that of the semiconductor device 1 according to Embodiment 1, and the description thereof is omitted.

[Modification of Semiconductor Device]

In the semiconductor device 1 according to Embodiment 3, the first gate electrode 51 of the first HEMT (Tr1) and the second gate electrode 52 of the second HEMT (Tr2) can be electrically short-circuited regardless of the presence of the separation region 6. For example, the first gate electrode 51 can be integrally composed of the same layer and the same material as those of the second gate electrode 52 or can be electrically connected to the second gate electrode 52 through another interconnection for a short circuit.

Moreover, the threshold voltage of the first HEMT (Tr1) is set different from that of the second HEMT (Tr2). Accordingly, the semiconductor device 1 according to Embodiment 3 can perform the same operation as that of the semiconductor device 1 according to Embodiment 1 if the short-circuited gate electrodes 51 and 52 are supplied with a gate signal turning on and off the first HEMT (Tr1) and a gate signal turning on and off the second HEMT (Tr2).

(Other Embodiments)

The present invention is described above with the plurality of embodiments, but the description and drawings constituting a part of the disclosure will not limit the present invention. The present invention can be applied to various substitutions, examples, and operational techniques.

For example, the HEMT (Tr) composed of the first HEMT (Tr1) and the second HEMT (Tr2) electrically connected to each other in the semiconductor device 1 according to Embodiments 1 to 3 can be located together with a HEMT not having such a parallel connection structure on the single substrate 2. In the present invention, moreover, it is possible to locate another element such as a metal insulator semiconductor (MIS) transistor or a normally-on (depression) type transistor instead of or in addition to the HEMT not having a parallel connection structure.

What is claimed is:

1. A semiconductor HEMT device, comprising:
   a first semiconductor layer;
   a second semiconductor layer provided on the first semiconductor layer with a heterojunction interface interposed therebetween;
   a two-dimensional carrier gas layer provided near the heterojunction interface in the first semiconductor layer;
   a first main electrode electrically connected to one end of the two-dimensional carrier gas layer;
   a second main electrode electrically connected to the other end of the two-dimensional carrier gas layer;
   a first gate electrode provided on the second semiconductor layer between a part of the first main electrode and a part of the second main electrode opposite to the part of the first main electrode; and
   a second gate electrode which is provided on the second semiconductor layer between another part of the first main electrode and another part of the second main electrode opposite to the another part of first main electrode with a separation region interposed between the first gate electrode and the second gate electrode and is controlled independently of the first gate electrode, the separation region reduces a carrier concentration of the two-dimensional carrier gas layer generated under the separation region or prevents the generation of the two-dimensional carrier gas layer to control an increase in sheet resistance of the two-dimensional carrier gas layer under the separation region.

2. The semiconductor HEMT device of claim 1, wherein the first gate electrode has a gate width larger than that of the second gate electrode.

3. The semiconductor HEMT device of claim 1, further comprising
a drive circuit individually connected to the first gate electrode and the second gate electrode and configured to supply the first gate electrode and the second gate electrode with gate signals to perform on and off controls thereof at different timings.

4. The semiconductor HEMT device of claim 1, wherein the separation region is larger than gate length dimensions of the first gate electrode and the second gate electrode and larger than the distance between the first gate electrode and the second gate electrode.

5. A semiconductor HEMT device, comprising
a first semiconductor layer;
a second semiconductor layer provided on the first semiconductor layer with a heterojunction interface interposed therebetween;
a two-dimensional carrier gas layer provided near the heterojunction interface in the first semiconductor layer;
a first main electrode electrically connected to one end of the two-dimensional carrier gas layer;
a second main electrode electrically connected to the other end of the two-dimensional carrier gas layer; and
a first gate electrode and a second gate electrode each provided on the second semiconductor layer between the first main electrode and the second main electrode opposite to the first main electrode, wherein
a carrier concentration of the two-dimensional carrier gas layer under the first gate electrode is different from a carrier concentration of the two-dimensional carrier gas layer under the second gate electrode thereby a threshold voltage right under the first gate electrode in the gate width direction is different from threshold voltage right under the second gate electrode in the gate width direction.

6. The semiconductor HEMT device of claim 1, wherein the separation region is a recess formed in a surface of the second semiconductor layer at least to the inside of the second semiconductor layer.

7. The semiconductor HEMT device of claim 1, wherein the separation region is formed of an impurity-introduced region having fluorine, iron, or magnesium of a high electronegativity.

* * * * *